(12) United States Patent
Lahreche

(10) Patent No.: US 8,431,964 B2
(45) Date of Patent: Apr. 30, 2013

(54) ELECTRONIC DEVICE WITH CONTROLLED ELECTRICAL FIELD

(75) Inventor: Hacène Lahreche, Paris (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 261 days.

(21) Appl. No.: 12/788,976

(22) Filed: May 27, 2010

(65) Prior Publication Data

US 2010/0258846 A1   Oct. 14, 2010

Related U.S. Application Data

(63) Continuation of application No. PCT/EP2008/066244, filed on Nov. 26, 2008.

(30) Foreign Application Priority Data

Nov. 27, 2007   (FR) ...................................... 07 59330

(51) Int. Cl.
*H01L 29/66*   (2006.01)

(52) U.S. Cl.
USPC ............ 257/194; 257/E29.246; 257/E21.403; 438/172

(58) Field of Classification Search .................. 257/194, 257/E29.246, E21.403; 438/172
See application file for complete search history.

(56) References Cited

U.S. PATENT DOCUMENTS

| | | |
|---|---|---|
| 2005/0189559 A1 | 9/2005 | Saito et al. |
| 2006/0124962 A1 | 6/2006 | Ueda et al. |
| 2007/0114569 A1 | 5/2007 | Wu et al. |
| 2007/0224710 A1 | 9/2007 | Palacios et al. |

FOREIGN PATENT DOCUMENTS

SG   201002472-7   8/2010

*Primary Examiner* — Jarrett Stark
(74) *Attorney, Agent, or Firm* — Edwards Wildman Palmer LLP; George W. Neuner; George N. Chaclas

(57) ABSTRACT

The disclosure relates to electronic devices and associated methods of manufacture including materials of the Group III/N. An exemplary device successively includes, from its base towards its surface: (i) a support substrate, (ii) a layer adapted to contain an electron gas, (iii) a barrier layer, and (iv) a superficial layer extending on at least one part of the surface of the barrier layer, wherein the superficial layer has an electrical field of which the current is controlled so that, in at least one first region of the superficial layer, the electrical field is weaker than in a second region of the superficial layer.

15 Claims, 5 Drawing Sheets

ELECTRONIC DEVICE WITH CONTROLLED ELECTRICAL FIELD

CROSS-REFERENCE TO RELATED APPLICATIONS

This patent application is a continuation of and claims priority to International Application No. PCT/EP2008/066244, filed Nov. 26, 2008, which in turn claims priority to French Patent Application No. 0759330, filed on Nov. 27, 2007. Each of the aforementioned patent applications in incorporated by reference herein in its entirety.

BACKGROUND

1. Field of the Disclosure

The present invention relates to an electronic device based on materials of the group III/N, such as a rectifier or a field effect transistor, for example of the HEMT type (High Electron Mobility Transistor) or of the MIS type (Metal Insulator Semiconductor).

2. Description of Related Art

The materials of the group III/N such as GaN for example, have piezo-electrical properties.

In an electronic device based on materials of the group III/N, a spontaneous polarization exists which creates an electrical field that is inherent to the non centro-symmetrical crystallographic structure of the material. Moreover, another piezo-electrical field is also induced by the different stresses present in the different layers of the structure. This electrical field of a piezo-electrical nature is substantially constant on the surface of the device, as long as it is not modified by etching, for example.

However, to improve the performance of electronic devices, it would be preferable to be able to control the distribution of the electrical field on the surface of the device, which is to say to be able to create, with a precise spatial resolution, regions on the surface of the device where the electrical field is weak, and other regions where the electrical field is strong.

In reference to FIG. 1, the type of electronic device that the invention intends to improve typically comprises from its base towards its surface: a support layer 1, a buffer layer 2, a channel layer 3, a barrier layer 4 and a superficial layer 7. This device may also comprise an ohmic contact electrode 5 and a Schottky contact electrode 8.

By the surface of the device, it is meant the upper layer of the device—in this case, the superficial layer 7, onto which electrodes may be deposited. This surface may be flat or not (for example if it has been etched).

In order to make the following description easier to understand, an orthogonal reference (x, y, z) system is defined that is attached to the device. The x and y directions define a horizontal plane, parallel to the base of the device, the z direction is vertical and is perpendicular to this plane. This reference will be conserved throughout the description.

In general, when seeking to optimize the performances of such an electronic device, it is the structure and the electrical field of the latter that are sought to be optimized in its z axis, which is to say by improving the structure along its thickness. The present disclosure provides improved methods and structures that address deficiencies in the art.

SUMMARY OF THE DISCLOSURE

Advantages of the present disclosure will be set forth in and become apparent from the description that follows. Additional advantages of the disclosure will be realized and attained by the methods and systems particularly pointed out in the written description and claims hereof, as well as from the appended drawings.

In one aspect, the invention proposes to optimize the performances of the device according to (x, y) at the surface of the device by a compromise between the following constraints. First, to ensure a good Schottky contact, an aim is to create a weak electrical field in the superficial layer close to the surface (for this purpose, reference may be made to the publication of Toshihide Kikkawa, "Fujitsu proves reliability of GaN HEMTs", Compound semiconductor, July 2006). Furthermore, the presence of parallel conductions in the superficial layer and in the barrier layer is preferably to be avoided as they impair the operation of the device.

Embodiments of the invention propose to achieve this purpose by maintaining a strong electrical field in the regions of the superficial layer located in the free zone of the device (wherein the free zone is the part of the surface of the device without an electrode). It is therefore proposed to control the distribution of the electrical field in the superficial layer in function of the regions of the electronic device, which is to say to create, on the one hand:

a strong electrical field in the free zones which is to say in the regions between the ohmic contact electrode and the Schottky contact electrode when the ohmic contact electrode is on the surface of the device, and a weak electrical field below the Schottky contact electrode.

Doping the superficial layer is known to generate an additional electrical field in it. This field is combined with the piezo-electrical field and allows it to be modified.

It has been shown in particular that strong doping of the superficial layer cancels out the electrical field in it. However, the known epitaxy methods only permit the homogeneous growth of a doped layer on its entire surface (which is to say with a same concentration by doping all points (x, y) of this layer) if the epitaxy is carried out continuously, without an intermediary etching step for example.

To control the modification of the distribution according to (x, y) of the electrical field at the surface of the device, one envisaged method would be to dope the structure in a controlled manner; more precisely, to use a doping gradient on the surface of the device, or on certain parts of this surface. It is pointed out that the doping must also be controlled according to the z direction of the depth of the device, as all of the layers which form it do not necessarily have to be doped.

However, the known methods of implanting or diffusing a dopant through a mask do not permit localized doping to be obtained with adequate spatial resolution according to the depth z. Indeed, the implantation of doping species is controlled at the scale of around 100 nanometers and the implantation profile is distributed in the form of a Gaussian distribution which extends according to the z axis. Such an implantation necessarily leads to the doping of a region situated in the depth of the device, but will not permit the doping of the superficial layer 7, of which the thickness is typically between 10 and 30 nm.

Therefore at present there is no method which proposes or allows the electrical field at the surface of the device to be controlled differently according to the regions of the superficial layer. One of the purposes of embodiments of the invention is therefore to control the distribution of the electrical field within the superficial layer with a spatial resolution according to (x, y, z) suited to the dimensions of the device.

This purpose is achieved by the formation at the surface of the device of a layer of which the structure and electrical properties—especially the electrical field—are, from a top view, different according to the different regions of the device.

In compliance with embodiments of the invention, an electronic device is proposed comprising materials of the group III/N, successively comprising from its base towards its surface: (i) a support substrate, (ii) a layer adapted to contain an electron gas, (iii) a barrier layer, (iv) a superficial layer extending on at least one part of the surface of the barrier layer, wherein this device is characterized in that the superficial layer has an electrical field of which the current is controlled so that, in at least one first region of the superficial layer, the electrical field is weaker than in a second region of the superficial layer. In a particularly advantageous manner, the difference of electrical field in the superficial layer is controlled at the scale of one nanometer.

According to a first embodiment of the device, in the second region, the superficial layer is formed by the superposition of a "covering" layer on a "surface" layer, and in the first region, the superficial layer is only formed by said covering layer.

According to a second embodiment of the device, in the second region, the superficial layer is formed by the superposition of a "covering" layer on a "surface" layer, and in the first region, the superficial layer is formed by the superposition of said covering layer on part of the thickness of the surface layer.

According to other possible characteristics of the device in compliance with the invention: (i) the materials of the surface layer and the covering layer include at least one material of the Group III and nitrogen, (ii) the surface layer has a dopant content of between 0 and $5 \times 10^{17}$ atoms/cm$^3$ and the covering layer has a dopant content of between $5 \times 10^{17}$ and $5 \times 10^{19}$ atoms/cm$^3$, wherein the dopant content of the covering layer is higher than that of the surface layer, (iii) the surface layer and the covering layer are made of the same material, (iv) in the first region, the thickness of the surface layer is between 0 and 10 nm and that of the covering layer is between 1 and 20 nm, (v) under the first region, the barrier layer is thinner than under the second region, (vi) the device further comprises at least one ohmic contact electrode and a Schottky contact electrode, (vii) the Schottky contact electrode is advantageously located above the first region of the superficial layer and the second region is the region of the superficial layer situated between the ohmic contact electrode and the Schottky contact electrode, and/or (viii) the surface of the covering layer has atomic steps separated by plates whose width is greater than 2 nm.

Another purpose of the invention relates to a method of manufacturing an electronic device. Such devices preferably successively include from their base towards their surface: (i) a support substrate, (ii) a layer adapted to contain an electron gas, and (iii) a barrier layer, wherein the method includes the formation, on the barrier layer, of a superficial layer in which the electrical field is controlled so that, in at least one first region of the superficial layer, the electrical field is weaker than in a second region of the superficial layer.

According to a first exemplary implementation of the method, the formation of the superficial layer includes: (i) the epitaxial growth of a surface layer on the barrier layer, (ii) the etching of a trench in the first region of the surface layer, wherein said trench is shallower than the thickness of the surface layer, so that a residual thickness of surface layer remains, (iii) epitaxial regrowth to grow, on the resulting structure, a doped covering layer, so that the superficial layer is formed, in the first region, by the superposition of the residual thickness of the surface layer and the covering layer and, in the second region, by the superposition of the surface layer and the covering layer.

According to a second implementation of the method, the formation of the superficial layer includes: (i) the epitaxial growth of a surface layer on the barrier layer, (ii) the etching of a trench in the first region of the surface layer, wherein said trench is deeper or equal in depth to the thickness of the surface layer, (iii) epitaxial regrowth to grow, on the resulting structure, a doped covering layer, so that the superficial layer is formed, in the first region, only by the covering layer and, in the second region, by the superposition of the surface layer and the covering layer. During step (ii), part of the thickness of the barrier layer may also be etched under the first region.

It is to be understood that the foregoing general description and the following detailed description are exemplary and are intended to provide further explanation of the disclosed embodiments.

The accompanying drawings, which are incorporated in and constitute part of this specification, are included to illustrate and provide a further understanding of the method and system of the disclosed embodiments. Together with the description, the drawings serve to explain principles of the disclosed embodiments.

DETAILED DESCRIPTION OF PREFERRED EMBODIMENTS

Reference will now be made in detail to the present preferred embodiments of the disclosure, examples of which are illustrated in the accompanying drawings. The method and corresponding steps of the disclosed embodiments will be described in conjunction with the detailed description of the system.

Firstly the basic structure of an electronic device to which the invention applies will be described, from its base towards its surface.

Figure 1:
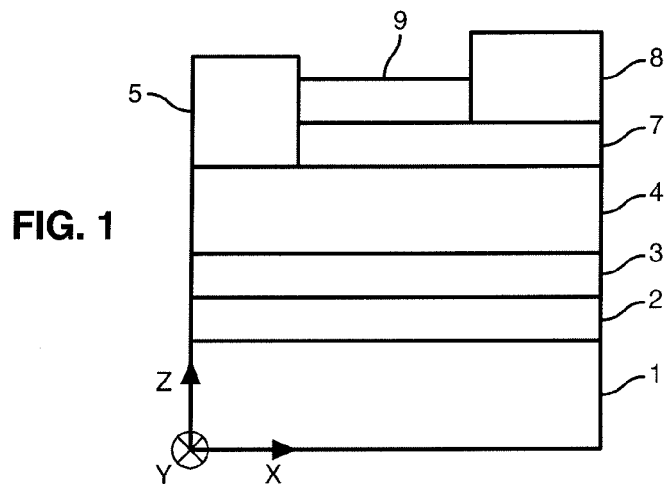
FIG. 1 is a cross sectional view of an electronic device of the prior art.
Figure 2:
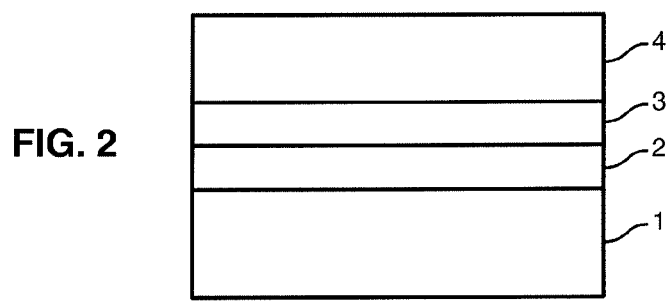
FIGS. 2 to 5 are cross sectional views illustrating the different steps of the manufacture of an electronic device in accordance with the invention.

In reference to FIG. 2, such a device includes at its base a support substrate 1, whose role is essentially to provide the rigidity of the device. The support substrate 1 is made of a semi-conductor material or not, such as for example Si, SiC, GaN, Al$_2$O$_3$ or AlN. The substrate 1 may even be a composite substrate such as an SOI (Silicon On Insulator) or a SopSiC (Silicon on pSiC).

As illustrated, the support substrate 1 is covered with a buffer layer 2 and a layer adapted to contain an electron gas. These two layers may be distinct, in which case the layer adapted to contain the electron gas is generally called a "channel layer" 3. However, it is also possible that these two layers are merged, wherein the buffer layer 2 is able, due to the hetero-junction formed at the interface with the barrier layer 4, to permit an electron gas to circulate. In this case, the channel is defined, in the upper part of the buffer layer, by the hetero-junction formed with the barrier layer, without it belonging to a layer distinct from the buffer layer.

The buffer layer 2 has good crystallographic quality and properties adapted to the epitaxial growth of the other layers which cover it. It therefore allows the crystallographic transition between the support layer 1 and the layer formed on the buffer layer to be ensured. The buffer layer 2 is formed by a binary, ternary or quaternary alloy of elements of the group III/N, such as for example GaN.

If the buffer layer is also adapted to contain the electron gas, it must be made of a material of which the forbidden band is weaker than that of the barrier layer to allow the formation and circulation of the electron gas in it.

If there is a channel layer 3 distinct from the buffer layer 2, it is made of a material of the group III/N gallium based and which may be a binary, ternary or quaternary alloy, such as GaN, BGaN, InGaN, AlGaN or other, with a forbidden band that is weaker than that of the barrier layer.

The role of the barrier layer 4 is to provide the free electrons to the structure: it is the donor layer. The barrier layer 4 comprises a material formed by a binary, ternary or quaternary alloy of elements of the group III/N. The choice of the materials of the barrier layer and the layer that may contain the electron gas is free provided that the material of the latter always has a forbidden band that is weaker than that of the material of the barrier layer.

Figure 3:
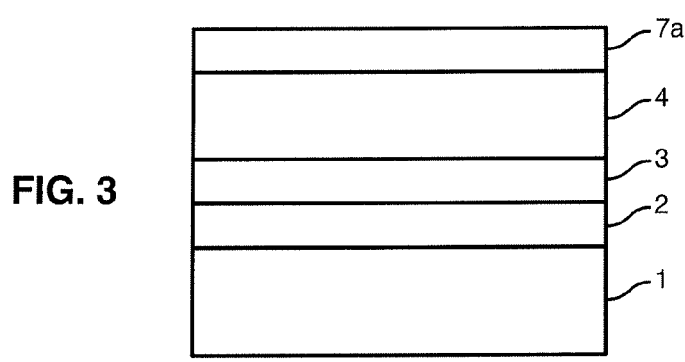
Figure 4:
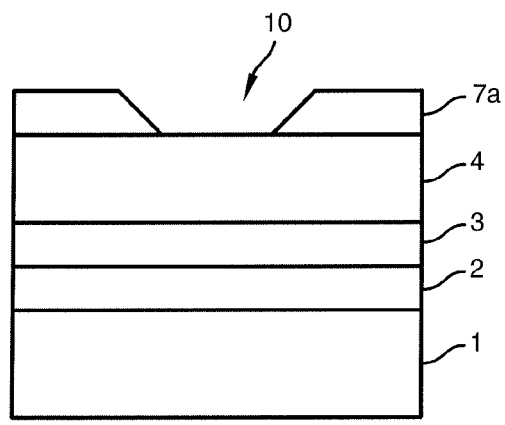

In general, embodiments of the method of the invention include a first step of forming by epitaxy a "surface" layer 7a at the surface of the structure previously described (FIG. 3). The materials that may be used for the surface layer 7a will be described below. Next, in reference to FIG. 4, the method includes carrying out controlled etching on at least one region of the surface layer 7a, to create at least one trench 10 whose depth may be smaller, equal to or greater than the thickness of the surface layer 7a. Next, the method includes forming by epitaxial regrowth a doped "covering" layer 7b, which covers the surface layer 7a and the trench 10.

The etching used may be an etching plasma based on chloride elements or chemical etching which permits, especially for GaN, oxidation and removal of material at atomic mono-layer scale.

The width of the trench 10 may for example be perfectly aligned on the width of the gate: in the case of a standard HEMT transistor whose gate measures laterally 250 nm, the etching may be carried out to form a trench of 250 nm also. By "epitaxial regrowth", it is meant an epitaxy step carried out after a technological step carried out on a layer obtained by epitaxy.

The technological step may typically be etching; this generally involves an operation that requires the epitaxial growth of the layer to be interrupted. A reminder is made that epitaxy is an orientated growth technique, with respect to one another, of two crystals which have a certain number of common elements of symmetry in their crystal lattices.

This term groups different techniques: apart from Molecular Beam Epitaxy (MBE), for example techniques may be cited such as MOCVD (Metal-organic Chemical Vapour Deposition), or LPCVD (Low Pressure Chemical Vapour Deposition) or even HVPE (Hydride Vapour Phase Epitaxy). The choice and control of the parameters of these different techniques such as the gaseous flows, the deposition temperature, the pressure or the vector gases permit deposition of material at the atomic monolayer scale. Embodiments of the invention may be implemented using any of these techniques. Advantageously, the epitaxial regrowth allows the crystal faults in the layer 7a to be repaired and thus to limit the current leaks at the surface, between the superficial layer 7 and the passivation layer 9.

Another embodiment includes forming a mask on the barrier layer, at the position of the Schottky contact electrode to deposit a non-doped surface layer 7a at the position of the free zones of the device. The mask is then removed to deposit the doped layer 7b by epitaxial regrowth in the entire surface.

The surface layer 7a is formed by a material formed by nitrogen and at least one element of column III of the periodic table. This layer is in principle not intentionally doped. It is preferably made of GaN, or AlGaN or InGaN and should be chosen so that its forbidden band is smaller than that of the barrier layer 4. This is the case for example when the barrier layer made of AlGaN comprises 50 to 70% of aluminum and the surface layer is formed by AlGaN with an aluminum content of around 20%. If the barrier layer of AlGaN has an aluminum content of around 20%, the aluminum content of the surface layer 7a will preferably be lower or equal to 5%. The material of the layer 7b is formed by nitrogen and at least one element of column III of the periodic table; it may be identical to that of the layer 7a. The doping typically uses silicon or germanium in a range of $5 \times 10^{17}$ to $5 \times 10^{19}$ atoms/cm$^3$.

According to one specific embodiment, the surface layer 7a may also be slightly doped. For example, this layer 7a may be made of GaN doped in a range of 0 to $5 \times 10^{17}$ atoms/cm$^3$ which advantageously permits the electron traps to be reduced. In this case, the covering layer 7b will be made of more strongly doped GaN, with a concentration, for example, in a range of $5 \times 10^{17}$ to $5 \times 10^{19}$ atoms/cm$^3$.

The covering layer 7b has a thickness that is substantially constant across the entire surface of the device, and its profile in the z axis follows that of the trench. Furthermore, it is doped, when formed by epitaxy, uniformly according to the axes x and y on its entire surface.

Structure of the Superficial Layer and of the Corresponding Electrical Field

Figure 5A:
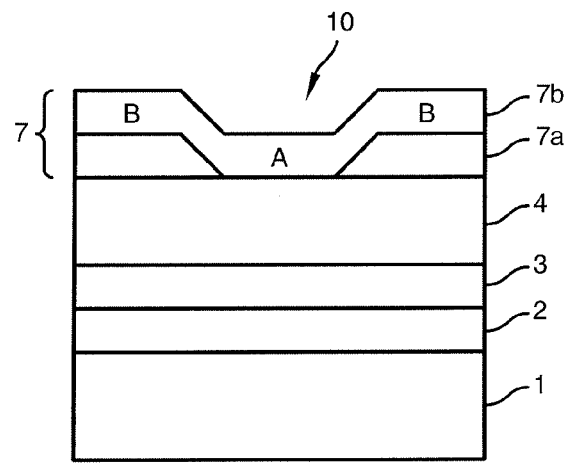
Figure 5B:
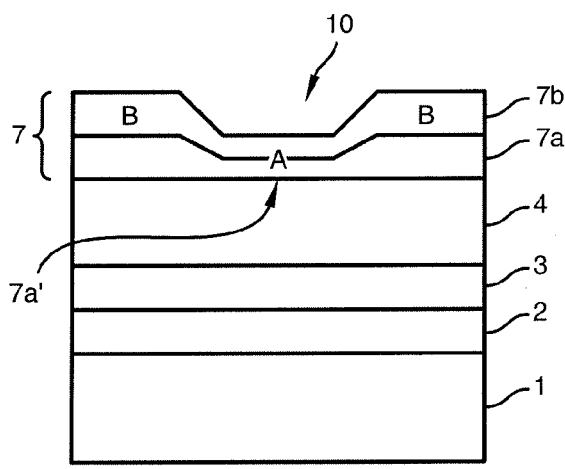

In reference to FIG. 5A, a surface configuration is thus obtained which reproduces the relief of the trench 10, with, from a top view, different regions that do not have the same doping gradient:
- the superficial layer 7 only comprises, in region A, the doped covering layer 7b—or (in the case illustrated in FIG. 5B where the trench 10 has only been etched on part of the thickness of the layer 7a) the layer 7b on the non etched part 7a' of the thickness of the layer 7a, and the electrical field is therefore low in this first region.
- the superficial layer 7 comprises, in region B, two superposed layers: the non-doped surface layer 7a and the doped covering layer 7b. The superposition of these two layers that are doped differently generates a strong electrical field in this second region of the superficial layer 7.

It is pointed out that it is sufficient that there is an etching step, even partial, of the surface layer 7a in region A then epitaxial regrowth on the residual part 7a' for a difference in electrical field to be observed in the superficial layer 7. However, the electrical field in region A is optimal (which is to say the lowest) when the entire thickness of the layer 7a is etched.

Region A corresponds to the trench 10 made in the device; preferably, this trench is located at the position provided for the Schottky contact electrode.

Region B corresponds to the free zone (s) of the device which is to say the zone (s) between the Schottky contact electrode and the ohmic contact electrode.

The control of the electrical field in regions A and B permits increasing the breakdown voltage of the device and then its life duration. Indeed, a low electric field (in region A) in the superficial layer in contact with the Schottky contact electrode avoids forming a breakdown point which is generally located at the interface between the metal of this electrode and the semiconducting material of the superficial layer. Furthermore, a strong electrical field (in region B) reduces the number of free charges in the superficial layer 7, reduces parallel conductions or current leaks and avoids the formation of breakdown points in the free zones of the device.

The control of the electrical field under the Schottky contact and in the free zones permits a difference in field between these two regions, for example of around 20%. The electrical field under the Schottky contact may for example be between 0 and 500 kVolt/cm, whereas the field of the free zones may be between 500 and 1000 kVolt/cm. The maximum value of the field in the free zones corresponds to the value of the critical field of the material beyond which the material is damaged. As it is not yet possible to measure the electrical field in GaN using available techniques, the above values are estimations.

These differences in the electrical field may be observed on the simulation curves of the conduction strip energy diagram which shows the depth of the device on the X axis—the origin O corresponding to the upper surface of the superficial layer, and in ordinates the energy E. In these graphs, the value of the electrical field corresponds to the slope of the curve.

Figure 6:
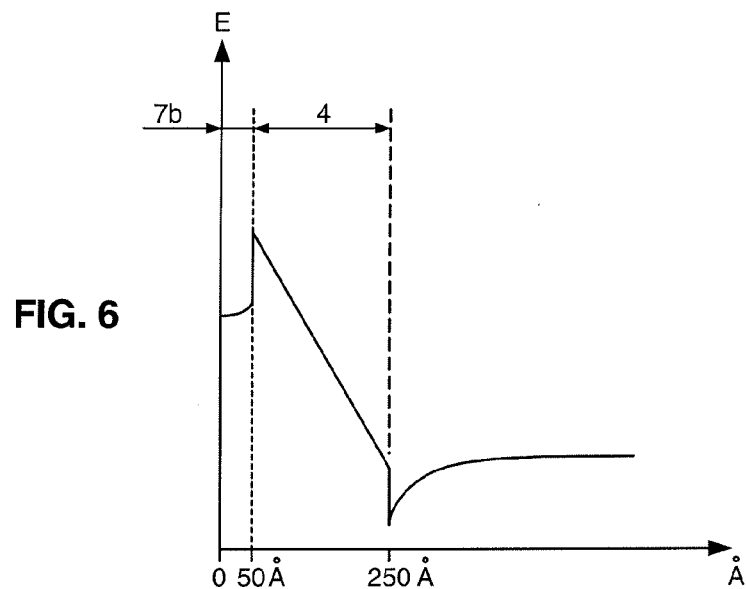
FIG. 6 is a simulation curve of the electrical field in a first region of the device.

FIG. 6 shows the simulation of the electrical field depending on the thickness of the structure in and under region A, in which the covering layer 7b is made of GaN doped with Si to $3 \times 10^{19}$ atoms/cm$^3$ and has a thickness of 5 nm. The slope of the curve is null at the origin: the electrical field is therefore null in region A.

Figure 7:
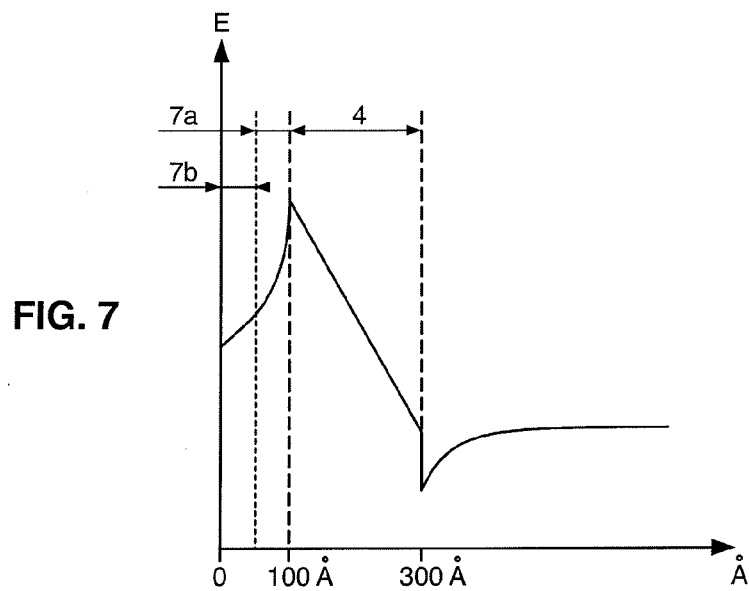
FIG. 7 is a simulation curve of the electrical field in a second region of the device.

FIG. 7 shows the simulation of the electrical field depending on the thickness of the structure in and under region B. In this region, there is a covering layer 7b made of GaN doped with Si to $2 \times 10^{19}$ atoms/cm$^3$ with a thickness of 5 nm, on a surface layer 7a of non-doped GaN with a thickness of 5 nm, on a barrier layer 4 made of AlGaN with a thickness of 20 nm. It may be seen that the curve is considerably sloped at the origin: the electrical field is therefore strong in region B of the superficial layer 7. The invention thus permits the electrical field to be controlled at the surface of the device (which is to say in the superficial layer) with a spatial resolution adapted to the dimensions of the device, especially to the thickness of the superficial layer. The methods used, which is to say etching and epitaxy, have a very fine spatial resolution—typically, to the scale of one nanometer. The invention therefore allows the difference in electrical field to be controlled to the scale of one nanometer. By this it is meant that it is possible to obtain, at two points of the superficial layer one nanometer apart, a different electrical field current.

In the structure described above, at least one ohmic contact electrode 5, a Schottky contact electrode 8 and a passivation layer (not shown) are then deposited. The order of the steps for forming them may vary according to the electronic device in question. Consequently, in the case of the MIS transistor, the Schottky contact electrode is formed on the insulating passivation layer whereas for the rectifier and the HEMT type transistor, the Schottky contact electrode is formed at the contact of the superficial layer 7 made of semi-conductor material.

The passivation layer, for example made of ZnO, Si$_3$N$_4$ or MgO, encapsulates the device. In general, it permits the surface of the semiconductor to be protected.

Formation of the Schottky Contact Electrode

Figure 8:
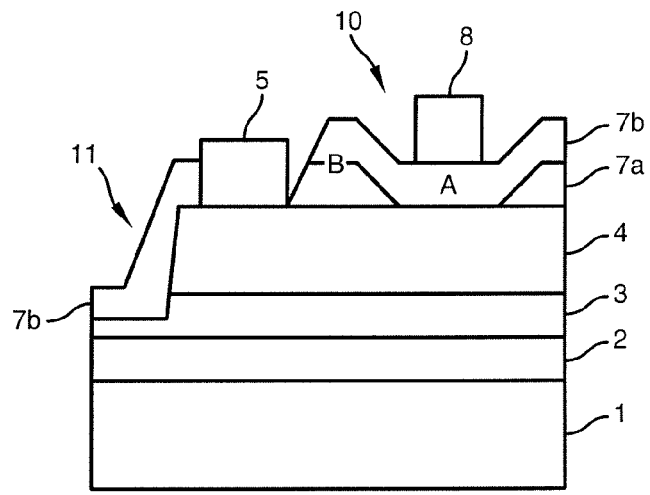
FIG. 8 is a cross sectional view of an electronic device in compliance with a first embodiment of the invention.

In reference to FIG. 8, which shows a HEMT type transistor for which, to simplify the figure, only one ohmic contact electrode 5 has been shown, the Schottky contact electrode 8 is deposited on the superficial layer 7.

Preferably, the Schottky contact electrode is deposited on region A, which is to say in the trench 10. Indeed, the thinner thickness of the superficial layer 7 in this region has a geometrical effect which permits the density of the electron gas to be increased in the channel layer 3. Furthermore, the closer positioning of the Schottky contact electrode 8 and the channel layer 3 permits better control of the electrons under this electrode. Finally, in region A, the superficial layer 7 only comprises the doped covering layer 7b—or the superposition of the covering layer 7b and the residual thickness 7a' of the surface layer—, in which the electrical field is weak which, as described, helps the Schottky contact.

Figure 9:
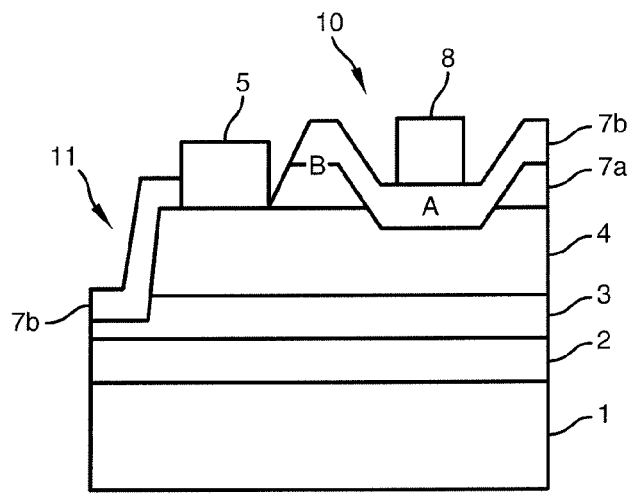
FIG. 9 is a cross sectional view of an electronic device according to a second embodiment of the invention.

According to one variant of an embodiment of the invention, shown in FIG. 9, the trench 10 under the Schottky contact electrode 8 may be formed not only in the surface layer 7a, but also in part of the barrier layer 4. This greater depth of the trench 10 permits further improvement of the control of the electrons, due to the closer positioning with the channel layer 3. However, as the barrier layer 4 forms the free electron tank of the channel layer 3, it must have a thickness that is sufficient to conserve satisfactory density of the electron gas. Therefore, a compromise needs to be defined between, on the one hand, the improvement of the operation provided by bringing the Schottky contact electrode 8 and the channel layer 3 closer together and, on the other hand, the reduction in the density of the electron gas caused by the etching of the barrier layer 4. In practice, it is considered that the remaining thickness of the barrier layer 4 must be greater than 2 nm.

Formation of the Ohmic Contact Electrode

Figure 10:
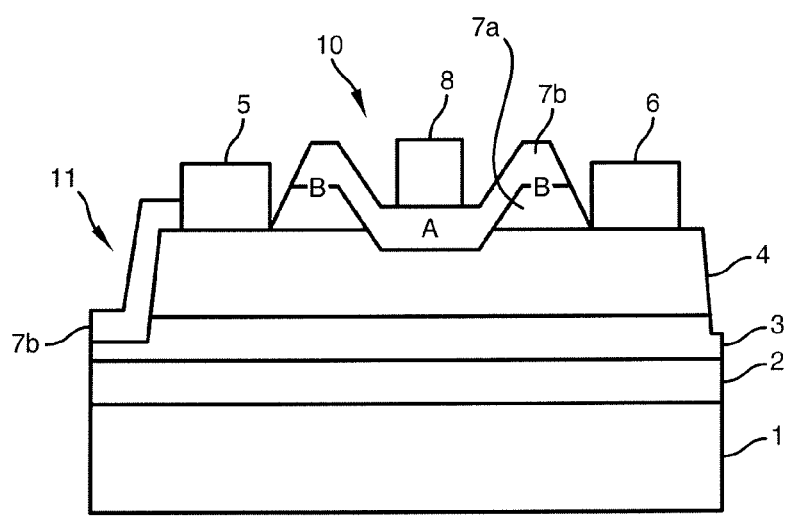
FIG. 10 illustrates a HEMT transistor in accordance with the invention.

The ohmic contact electrode 5 permits the carriers to be injected or collected. In the case of a HEMT type transistor as shown in FIG. 10, there are two ohmic contact electrodes: the source 5 is the electrode which injects the carriers into the structure, whereas the drain 6 is the electrode which collects the carriers. The ohmic contact electrode 5 is formed by a superposition of metallic layers deposited on the upper face of the barrier layer 4 to ensure good ohmic contact.

For this purpose, it is generally preferable to etch the superficial layer 7 on its entire thickness up to the barrier layer 4, or even into the thickness of the barrier layer 4. Indeed, the direct contact between the electrode 5 and the barrier layer 4 that is rich in free electrons allows the ohmic contact to be improved and thus contributes to improving the operation of the electronic device. In the case of the rectifier, the single ohmic contact electrode may be located on the rear face of the device.

Formation of Insulation Etching

According to one specific embodiment, it is possible, to insulate different devices made in a same plate, to etch an insulation trench, identified by the reference 11 in FIG. 8. This etching is carried out on the entire periphery of the device, on a depth which permits the insulating buffer layer 2 to be reached. This etching is carried out after the formation of the surface layer 7a but before the epitaxial regrowth that allows the covering layer 7b to be formed.

Finally, the epitaxial regrowth has a positive effect on the defects that may be generated by the etching of the surface layer 7a, to form the trench 10 or the insulation trench 11. It has indeed been observed that the epitaxial regrowth permits the etched crystal system to be repaired and thus eliminate the leak currents at the interface between the superficial layer 7 and the passivation layer. Indeed, the effect of the epitaxial regrowth is to re-form and repair the crystal lattice of the surface layer 7a damaged by the etching, which results in, at the interface between the covering layer 7b and the passivation layer, a restriction of the leak currents.

It has indeed been observed that a surface damaged by etching is characterized by a series of atomic steps that are less 2 nm apart. Between two adjacent steps, plates may therefore be defined, which have a width of less than 2 nm. However, the epitaxial regrowth on this damaged surface permits the growth of a covering layer whose surface comprises atomic steps separated by at least 2 nm, which is to say plates that are more than 2 nm in width.

EXAMPLES

Example 1

Using a technique such as MBE (Molecular Beam Epitaxy) or MOCVD (Metal Oxide Chemical Vapour Deposition), a structure is formed comprising from its base towards its surface:
  (i) a channel layer made of GaN between 2 and 50 nm thick on a support substrate,
  (ii) a barrier layer made of AlGaN with an aluminum content of around 30%, between 2 and 50 nm thick, and
  (iii) a surface layer made of GaN that is not intentionally doped between 1 and 10 nm thick.

On this structure, etching is carried out to form the gate pit. For this purpose, masking is applied to protect the rest of the structure, then the unprotected region is etched, for example using chlorine based plasma, by dry or wet etching. The type of mask and the anisotropy of the etching are chosen so as to control the side slopes of the etching. A gate pit is thus formed in the surface layer to a thickness of 1 nm at least and at maximum up to the barrier layer is reached.

If desired, insulation etching may be carried out up to the insulating material of the buffer layer. Epitaxial regrowth is then carried out to form a covering layer made of GaN doped to $10^{19}$ atoms/cm$^3$, with a thickness of 1 to 20 nm.

The covering layer and the surface layer may then possibly be etched up to the barrier layer at the position of the ohmic contacts. Finally, the drain, gate and source electrodes are formed and a passivation layer is deposited.

Example 2

Using a technique such as MBE or MOCVD, a structure is formed comprising from its base towards its surface:
  (i) a channel layer made of GaN between 2 and 50 nm thick on a support substrate, and
  (ii) a barrier layer made of AlGaN with an aluminum content of around 60%, 6 nm thick,—a surface layer made of GaN that is not intentionally doped between 1 and 10 nm thick.

On this structure, etching is carried out to form the gate pit in the thickness of the barrier layer. The remaining thickness of the barrier layer in this region after etching is to be at least 2 nm. Insulation etching may be carried out up to the insulating material of the structure. Epitaxial regrowth is then carried out to form a covering layer made of GaN doped to $10^{18}$ atoms/cm$^3$, with a thickness of 1 to 20 nm. The covering layer and the surface layer may then possibly be etched up to the barrier layer at the position of the ohmic contacts. Finally, the drain, gate and source electrodes are formed and a passivation layer is deposited.

Example 3

Using a technique such as MBE or MOCVD, a structure is formed comprising from its base towards its surface:

(i) a channel layer made of GaN between 2 and 50 nm thick on a support substrate;
  (ii) a barrier layer made of AlInN with an indium content of around 18%, 6 nm thick; and
  (iii) a surface layer made of GaN that is not intentionally doped 2 nm thick.

On this structure, the surface layer is etched on the entire thickness by dry etching, so as to form the gate pit. Insulation etching may be carried out up to the insulating material of the structure. Epitaxial regrowth is then carried out to form a covering layer made of GaN doped to $10^{19}$ cm$^3$, 2 nm thick. The covering layer and the surface layer may then possibly be etched up to the barrier layer at the position of the ohmic contacts. Finally, the drain, gate and source electrodes are formed and a passivation layer is deposited.

Example 4

Using a technique such as MBE or MOCVD, a structure is formed comprising from its base towards its surface:
  (i) a channel layer made of GaN between 2 and 50 nm thick on a support substrate;
  (ii) a barrier layer made of BGaN with a boron content of around 10%, 6 nm thick; and
  (iii) a surface layer made of GaN that is not intentionally doped 2 nm thick.

On this structure, the surface layer is etched on the entire thickness by dry etching, so as to form the gate pit. Insulation etching may be carried out on the entire structure. Epitaxial regrowth is then carried out to form a covering layer made of GaN doped to $10^{19}$ cm$^3$, 2 nm thick. The covering layer and the surface layer may then possibly be etched up to the barrier layer at the position of the ohmic contacts. Finally, the drain, gate and source electrodes are formed and a passivation layer is deposited.

The methods and systems of the disclosed embodiments, as described above and shown in the drawings, provide for devices with superior attributes. It will be apparent to those skilled in the art that various modifications and variations can be made in the device and method of the disclosed embodiments without departing from the spirit or scope of the disclosure. Thus, it is intended that the disclosed embodiments include modifications and variations that are within the scope of the appended claims and their equivalents.

What is claimed is:
1. An electronic device including materials of the Group III/N, successively comprising from a base towards a top surface thereof:
  (a) a support substrate;
  (b) a layer adapted and configured to contain an electron gas;
  (c) a barrier layer; and
  (d) a superficial layer extending on at least one part of a surface of the barrier layer, wherein the superficial layer creates an electrical field at a portion of the top surface, the electrical field having an intensity controlled so that, in at least one first region of the superficial layer, the electrical field is weaker than above a second region of the superficial layer, the at least one region being thinner than the second region.

2. An electronic device according to claim 1, wherein the difference in electrical field in the superficial layer is controlled on a scale of about one nanometer.

3. An electronic device according to claim 2, wherein, in the second region, the superficial layer is formed by the superposition of a covering layer on a surface layer, and wherein, in the first region, the superficial layer is only formed by said covering layer.

4. An electronic device according to claim 2, wherein, in the second region, the superficial layer is formed by the superposition of a covering layer on a surface layer, and wherein, in the first region, the superficial layer is formed by the superposition of the covering layer on at least a portion of the thickness of the surface layer.

5. An electronic device according to claim 3, wherein the materials of the surface layer and the covering layer include at least one material of the Group III and nitrogen.

6. An electronic device according to claim 3, wherein the surface layer has a dopant content of between 0 and $5\times10^{17}$ atoms/cm3 and wherein the covering layer has a dopant content of between $5\times10^{17}$ and $5\times10^{19}$ atoms/cm3, wherein the dopant content of the covering layer is higher than that of the surface layer.

7. An electronic device according to claim 6, wherein the surface layer and the covering layer are made of the same material.

8. An electronic device according to claim 3, wherein, in the first region, the thickness of the surface layer is between 0 and 10 nm, and wherein the thickness of the covering layer is between 1 and 20 nm.

9. An electronic device according to claim 3, wherein, under the first region, the barrier layer is thinner than under the second region.

10. An electronic device according to claim 1, wherein the device further comprises at least one ohmic contact electrode and a Schottky contact electrode.

11. An electronic device according to claim 10, wherein the Schottky contact electrode is positioned above the first region of the superficial layer, and wherein the second region is the region of the superficial layer positioned between the ohmic contact electrode and the Schottky contact electrode.

12. An electronic device according to claim 3, wherein the surface of the covering layer has atomic scale steps separated by plates of which the width is greater than 2 nm.

13. An electronic device with a controlled electrical field comprising:
    (a) a support substrate for providing rigidity;
    (b) a channel layer on the support substrate for containing electron gas;
    (c) a barrier layer on the channel layer for providing free electrons; and
    (d) a superficial layer covering at least a portion of the barrier layer, wherein the superficial layer defines a trench region with a first electrical field and a non-trench region with a second electrical field, wherein the first electrical field is weaker than the second electrical field, wherein the trench region of the superficial layer is thinner than the non-trench region.

14. An electronic device with a controlled electrical field comprising:
    (a) a support substrate for providing rigidity;
    (b) a channel layer on the support substrate for containing electron gas;
    (c) a barrier layer on the channel layer for providing free electrons; and
    (d) a superficial layer covering at least a portion of the barrier layer, wherein the superficial layer defines a trench region with a first electrical field and a non-trench region with a second electrical field, wherein the first electrical field is weaker than the second electrical field, wherein the superficial layer includes a surface layer of varying thickness covering at least part of the portion and a covering layer covering the surface layer.

15. An electronic device as recited in claim 14, wherein the surface layer exposes the barrier layer in the trench region and the covering layer covers the exposed barrier layer.

* * * * *